United States Patent [19]
Hayakawa et al.

[11] Patent Number: 4,545,057
[45] Date of Patent: Oct. 1, 1985

[54] WINDOW STRUCTURE OF A SEMICONDUCTOR LASER

[75] Inventors: Toshiro Hayakawa, Nara; Nobuyuki Miyauchi; Takahiro Suyama, both of Tenri; Seiki Yano, Kashihara, all of Japan

[73] Assignee: Sharp Kabushiki Kaisha, Osaka, Japan

[21] Appl. No.: 486,646

[22] Filed: Apr. 20, 1983

[30] Foreign Application Priority Data

Aug. 30, 1982 [JP] Japan ............................. 57-151537

[51] Int. Cl.$^4$ ............................................. H01S 3/19
[52] U.S. Cl. ............................. 372/45; 357/17; 372/46; 372/48
[58] Field of Search ............... 372/45, 46, 48; 357/17

[56] References Cited

FOREIGN PATENT DOCUMENTS 0138386 10/1979 Japan ............................. 372/46
0036184 4/1981 Japan ............................. 372/46

*Primary Examiner*—James W. Davie
*Attorney, Agent, or Firm*—Birch, Stewart, Kolasch & Birch

[57] ABSTRACT

A window V-channeled substrate inner stripe semiconductor laser includes window regions formed at both ends of a stimulated region. The stimulated region includes a crescent active layer, and each of the window regions includes a plane active layer for transferring the laser beam emitted from the stimulated region to the mirror. An optical guide layer is formed on said crescent and plane active layers in order to ensure a stable operation of the window structure semiconductor laser.

8 Claims, 9 Drawing Figures

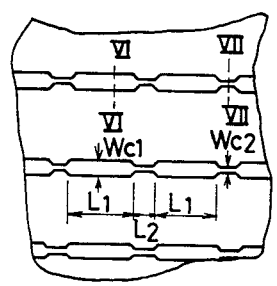
FIG. 5
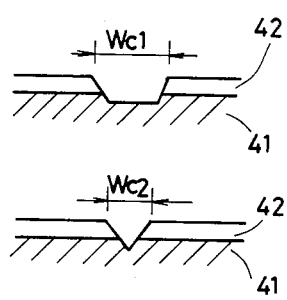
FIG. 6
FIG. 7
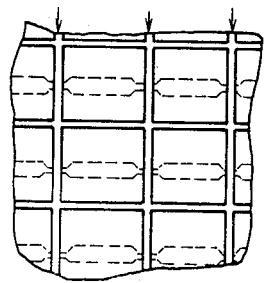
FIG. 8
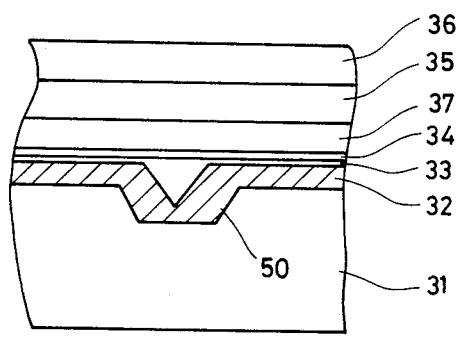
FIG. 9

WINDOW STRUCTURE OF A SEMICONDUCTOR LASER

BACKGROUND AND SUMMARY OF THE INVENTION

The present invention relates to a semiconductor laser and, more particularly, to a laser device construction which ensures stable operation.

A semiconductor laser enjoys a limited period of life depending on deterioration at mirrors which function as the light emitting facet. Furthermore, a semiconductor laser may be damaged at mirrors if the semiconductor laser is driven in a considerably high optical power. The maximum optical power for catastrophic optical damage is about $10^6$ W/cm$^2$ in the conventional semiconductor laser. Moreover, the photon density becomes high near the mirrors and, therefore, the beam absorption near the mirrors greatly influences the operating life period of the semiconductor laser.

It is a great desire to increase the maximum optical power for catastrophic optical damage to achieve a stable high power oscillation. Furthermore, the absorption of the high density laser beam near the mirrors must be restricted as low as possible in order to minimize the mirror deterioration.

To achieve the above desires, a window structure semiconductor laser has been proposed in, for example, Applied Physics Letters Vol. 34 (1979) P. 637, and a crank structure TJS laser has been proposed in, for example, Jpn. J. Appl. Phys. Vol. 21 (1982) Supplement 21-1, P. 347.

Generally, the conventional window structure semiconductor laser does not have the optical waveguide formed in the window region along the junction. Thus, the laser beam diffuses in the window region so as to reduce the beam amount directed to the stimulated region after the reflection at the mirror. This will reduce the oscillation efficiency, and will increase the threshold current.

Accordingly, an object of the present invention is to increase the oscillation efficiency in a window structure semiconductor laser.

Another object of the present invention is to provide a semiconductor laser which stably emits the laser beam in the visible spectral range.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an optical waveguide is formed also in the window region, whereby the beam waists for the field confined along and perpendicular to the junction exist at the mirror. More specifically, a V-shaped groove is formed in the substrate. A crescent active layer and a plane active layer are formed in the stimulated region and the window region, respectively, through a liquid phase epitaxy method under the same condition. This construction is named the window V-channeled substrate inner stripe (VSIS) laser.

The thus formed window region functions to suppress the higher transverse mode generated in the stimulated region so that only the fundamental transverse mode is transferred in the window region and developed through the mirror. The window VSIS laser of the present invention has low threshold current because the current is perfectly confined in the V channel by the inner stripe.

In a preferred form, an optical guide layer is formed on the active layer to ensure a stable operation at a high output power above 15 mW at one mirror, and to enable a pulse output over 100 mW at one mirror.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 5 is a schematic plan view showing a step of manufacturing the window structure semiconductor laser of FIG. 2;

FIG. 6 is a schematic sectional view of an essential part of the window structure semiconductor laser of FIG. 2 taken along line IV—IV of FIG. 5;

FIG. 7 is a schematic sectional view of an essential part of the window structure semiconductor laser of FIG. 2 taken along line VII—VII of FIG. 5;

FIG. 8 is a schematic plan view showing another step of manufacturing the window structure semiconductor laser of FIG. 2; and FIG. 9 is a sectional view of a window region in another embodiment of a window structure semiconductor laser of the present invention.

DESCRIPTION OF THE PREFERRED EMBODIMENTS

Figure 1:
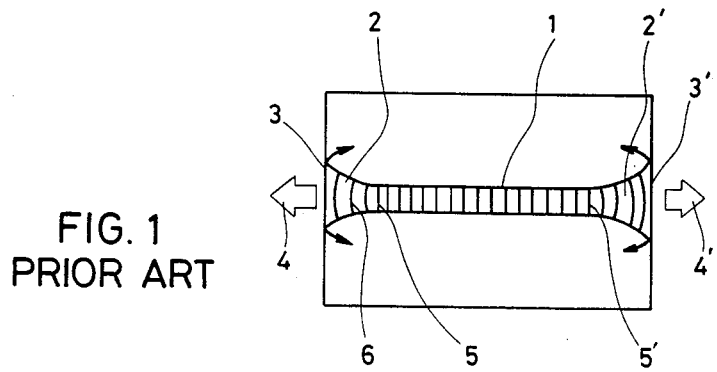
FIG. 1 is a schematic plan view showing wave fronts in the conventional window structure semiconductor laser.

In order to facilitate a better understanding of the invention, the conventional window structure semiconductor laser will be first described with reference to FIG. 1.

The window structure semiconductor laser generally includes a stripe shaped stimulated region 1, and a pair of window regions 2 and 2' formed at the both ends of the stimulated region 1. Laser beams 4 and 4' are emitted through mirrors 3 and 3' which are positioned at the end of the window regions 2 and 2', respectively. The ends 5 and 5' of the stimulated region 1 are placed between the mirrors 3 and 3'. Wave fronts 6 represent the transmission of the laser beam in the window regions 2 and 2'.

In the above-mentioned conventional window structure semiconductor laser, the beam waist for the field confined along the junction exists at the ends 5 and 5' of the stimulated region 1. The beam waist for the field perpendicular to the junction, however, exists at the mirrors 3 and 3'. The thus created astigmatism provides problems when the laser is coupled with an optical system.

Figure 2:
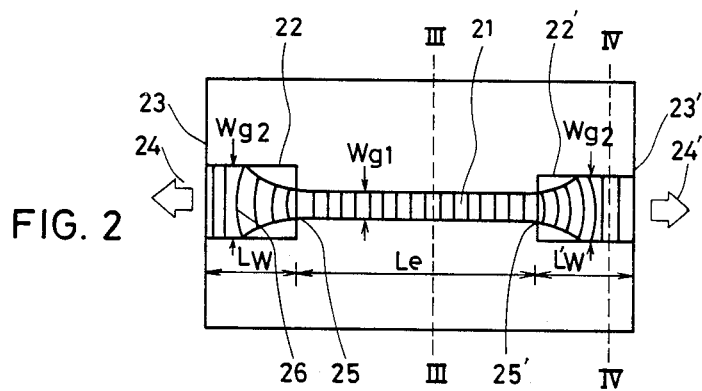
FIG. 2 is a schematic plan view showing wave fronts in an embodiment of a window structure semiconductor laser of the present invention.

FIG. 2 shows an embodiment of a window structure semiconductor laser of the present invention. The window structure semiconductor laser of FIG. 2 includes a stimulated region 21, and a pair of window regions 22 and 22' formed at the both ends of the stimulated region 21. The stimulated region 21 has a length $L_e$ and a waveguide width $W_{g1}$. The window regions 22 and 22' have the waveguide width $W_{g2}$ and the length $L_w$ and $L_w'$, respectively. Laser beams 24 and 24' are emitted through mirrors 23 and 23' which are located at the ends of the window regions 22 and 22', respectively. The length $L_e$ of the stimulated region 21 is determined by the ends 25 and 25' which are positioned at the both ends of the stimulated region 21. Wave fronts 26 depict the laser beam transmission in the window regions 22 and 22'.

Figures 3, 4:
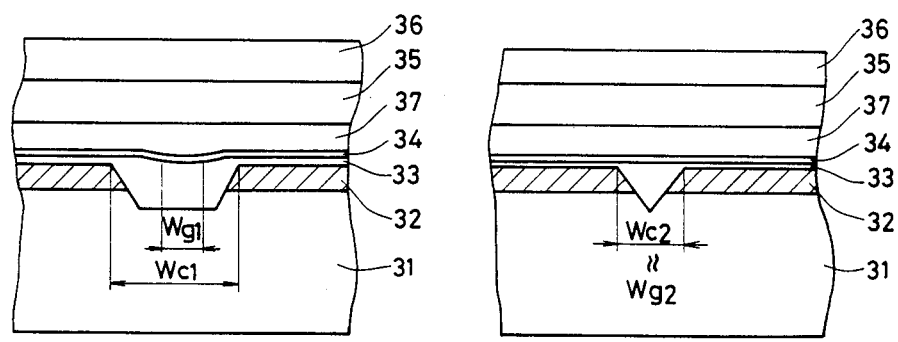
FIG. 3 is a sectional view of the window structure semiconductor laser of FIG. 2 taken along line III—III of FIG. 2.
FIG. 4 is a sectional view of the window structure semiconductor laser of FIG. 2 taken along line IV—IV of FIG. 2.

FIG. 3 shows the construction of the stimulated region 21, and FIG. 4 shows the construction of the window regions 22 and 22'.

The window structure semiconductor laser of FIG. 2 includes a p-GaAs substrate 31, and an n-GaAs current blocking layer 32 formed on the p-GaAs substrate 31.

A V-shaped groove is formed in the current blocking layer 32 and the substrate 31. A p-GaAlAs cladding layer 33, a GaAs or GaAlAs active layer 34, an n-GaAlAs optical guide layer 37, an n-GaAlAs cladding layer 35, and an n-GaAs cap layer 36 are formed on the current blocking layer 32 as shown in FIGS. 3 and 4.

As shown in FIG. 3, the stimulated region has the same construction as the VSIS laser with a crescent active layer, and the window region has, as shown in FIG. 4, the same construction as the VSIS laser with a plane active layer. The VSIS laser is described in, for example, Transaction of Institute of Electronics and Communication Engineers of Japan, The Technical Group of Electron Devices (ED-81-42, 1981, P. 31). That is, the VSIS laser is an inner stripe laser, wherein a groove is formed in a substrate so that light and current is confined in a current path.

More specifically, the current for laser oscillation is blocked by the n-GaAs current blocking layer 32, whereby the current flows only in the channel portion of the width $W_{c1}$ and $W_{c2}$. The channel is constructed to have the width which fulfills the relation $W_{c1} > W_{c2}$. When the active layer 34 is formed on the thus formed channel portions, the crescent active layer is formed at the channel portion of the width $W_{c1}$, and the plane active layer is formed at the channel portion of the width $W_{c2}$ under the same manufacturing condition. The crescent active layer functions to form an index guide of which width $W_{g1}$ is narrower than the channel width $W_{c1}$. The plane active layer functions to form a waveguide based on the reduction of the effective refractive index due to the light absorption by the n-GaAs current blocking layer 32 at the edges of the channel portion. The thus formed waveguide has the width $W_{g2}$ which is substantially identical with the channel width $W_{c2}$.

The AlAs mole fraction of the active layer at the crescent portion is lower than that of the active layer at the plane portion by about 0.01 through 0.03 even when the crescent active layer and the plane active layer are formed under the same manufacturing condition. By utilizing this phenomenon, the laser beam absorption near the mirrors can be minimized when the energy gap of the plane active layer is formed considerably greater than the energy of the laser beam generated in the crescent active layer. This will enhance the maximum optical power for catastrophic optical damage.

Generally, a considerably large difference of the refractive index in the order of $10^{-2}$ exisits in the crescent active layer along the junction due to the variation of the thickness of the crescent active layer. Furthermore, the width $W_{g1}$ of the waveguide is narrower than the channel width $W_{c1}$ and, therefore, the laser beam is strongly confined along the junction in the crescent active layer region. Thus, the photon density becomes high as compared with a device having the plane active layer. This will reduce the operating life period of the semiconductor laser having the crescent active layer.

In accordance with the present invention, the optical guide layer 37 is formed on the active layer 34 for reducing the photon density in the active layer 34. The optical guide layer 37 must be formed above the active layer 34 rather than under the active layer 34 in order to provide the crescent active layer 34 and to give a sufficient thickness to the optical guide layer 37.

A method for manufacturing the window structure semiconductor laser of FIG. 2 will be described with reference to FIGS. 5 through 8.

First, Te-doped n-GaAs layer 42 ($n = 6 \times 10^{18}$ cm$^{-3}$) of 0.6 μm thickness is grown on a Zn-doped p-GaAs substrate 41 ($P = 1 \times 10^{19}$ cm$^{-3}$) through the use of a liquid phase epitaxial method. Then, a stripe shaped pattern is formed on the n-GaAs layer 42 as shown in FIG. 5 through the use of photolithography technique. A preferred resist is AZ1350 manufactured by Shipley Company. The pattern has alternatingly repeating wider windows of 150 μm length ($L_1$) and 6 μm width ($W_{c1}$), and narrower windows of 100 μm length ($L_2$) and 3 μm width ($W_{c2}$). Through the windows the GaAs layer 42 is etched through the use of a sulfuric acid system etchant. FIG. 6 shows an etched condition at the section VI—VI of FIG. 5, which corresponds to the stimulated region. FIG. 7 shows an etched condition of the section VII—VII of FIG. 5, which corresponds to the window region.

Thereafter, the p-Ga$_{0.5}$Al$_{0.5}$As cladding layer 33, the p-Ga$_{0.85}$Al$_{0.15}$As active layer 34, the n-Ga$_{0.65}$Al$_{0.35}$As optical guide layer 37, the n-Ga$_{0.5}$Al$_{0.5}$As cladding layer 35, and the n-GaAs cap layer 36 are sequentially formed on the GaAs current blocking layer 32(42) through the use of a liquid phase epitaxial method. The layers 33, 34, 37, 35 and 36 have the thickness of 0.15 μm, 0.1 μm, 0.5 μm, 1.0 μm and 2 μm, respectively, at the flat sections thereof. The active layer 34 has the thickness of 0.2 μm at the center of the crescent portion, and the optical guide layer 37 has the thickness of 0.7 μm at the center of the crescent portion.

The rear surface of the substrate 31 is lapped so that the wafer thickness becomes 100 μm. Electrode layers are formed by evaporating Au-Ge-Ni on the n-GaAs cap layer 36 and Au-Zn on the lapped rear surface of the p-GaAs substrate 31, respectively. The thus formed electrode layers are alloyed at 450° C. Thereafter, Al is evaporated on the rear surface of the p-GaAs substrate 31, and the Al is patterned in accordance with the inner channels as shown in FIG. 8. The thus formed crystal is cleaved at the center of the window region, which has the length $L_2$, to obtain the total cavity length of 250 μm with the window regions of 50 μm length at the both ends thereof.

The above constructed window structure semiconductor laser of FIG. 2 exhibits the laser oscillation of the wavelength 7800 Å at $I_{th}$=50 mA. The maximum optical power for catastrophic optical damage is about 200 mW. The beam waist for the field confined along the junction exists within 5 μm from the mirror.

A comparative test was carried out at 50° C. and at an output power of 20 mW to compare the operating characteristics between the semiconductor laser of FIG. 2 which has the optical guide layer 37 and a semiconductor laser having a similar construction as the semiconductor laser of FIG. 2 but not having the optical guide layer. The driving current increased at a rate of about 10 mA/Kh in the semiconductor laser wherein the n-cladding layer is formed on the active layer without the interposition of the optical guide layer. Contrarily, the driving current increased at a rate of about 1 mA/Kh in the semiconductor laser of FIG. 2.

FIG. 9 shows another embodiment of a semiconductor laser of the present invention.

In the embodiment of FIGS. 2 through 8, the current flows from the substrate 31 to the cladding layer 33 even in the window region. In the embodiment of FIG. 9, the cladding layer 33 is covered by the current blocking layer 32 in the window region. That is, in the window region, the current blocking layer 32 is formed after a groove 50 is formed in the substrate 31. Then, the groove as shown in FIG. 4 is formed in the current blocking layer 32 in a manner that the groove does not reach the substrate 31. In the embodiment of FIG. 9, the heat generation and the carrier recombination without light emission are minimized in the window region.

The present invention is applicable not only to the window structure semiconductor laser of the GaAlAs type but also to the various window structure semiconductor lasers of, for example, the InGaAsP type.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a window structure semiconductor laser comprising:
a stimulated region including a crescent active layer;
window regions formed at both ends of said stimulated region, each of said window regions including a plane active layer;
a cladding layer formed on one side of said crescent and plane active layers in said stimulated region and said window regions; and
an optical guide layer formed on the other side of said crescent and plane active layers in said stimulated region and said window regions.

2. The window structure semiconductor laser of claim 1, wherein:
said stimulated region defines a waveguide width which is narrower than a waveguide width determined by said each of window regions.

3. The window structure semiconductor laser of claim 1, wherein said optical guide layer has a refractive index which is higher than that of said cladding layer and lower than that of said crescent and plane active layers.

4. In a window structure semiconductor laser comprising:
a substrate;
a current blocking layer formed on said substrate;
a V-shaped groove formed in said current blocking layer, said V-shaped groove having a medial wider section and narrower sections disposed at both ends lateral to said wider section;
a cladding layer formed on said current blocking layer;
an active layer formed on said cladding layer, said active layer having a crescent portion formed at a position corresponding to said wider section of said V-shaped groove formed in said current blocking layer, and plane portions formed at positions corresponding to said narrower sections of said V-shaped groove formed in said current blocking layer; and
an optical guide layer formed on said active layer, said optical guide layer having a refractive index which is higher than that of said cladding layer and lower than that of said active layer.

5. The window structure semiconductor laser of claim 4, wherein said current blocking layer has thicker sections formed at the positions corresponding to said narrower sections of said V-shaped groove, whereby said cladding layer formed between said current blocking layer and said active layer is separated from said substrate by said current blocking layer at said narrower sections of said V-shaped groove.

6. The window structure semiconductor laser of claim 4, wherein:
said substrate comprises a p-GaAs substrate;
said current blocking layer comprises an n-GaAs layer;
said cladding layer comprises a p-GaAlAs layer;
said activelayer comprises a GaAs layer; and
said optical guide layer comprises an n-GaAlAs layer.

7. The window structure semiconductor laser of claim 4, wherein:
said substrate comprises a p-GaAs substrate;
said current blocking layer comprises an n-GaAs layer;
said cladding layer comprises a p-GaAlAs layer;
said active layer comprises a GaAlAs layer; and
said optical guide layer comprises an n-GaAlAs layer.

8. The window structure semiconductor laser of claim 7, wherein an AlAs mole fraction of said active layer at said crescent portion is lower than that of said active layer at said plane portion.

* * * * *